United States Patent
Shanker et al.

(10) Patent No.: US 7,211,525 B1
(45) Date of Patent: May 1, 2007

(54) HYDROGEN TREATMENT ENHANCED GAP FILL

(75) Inventors: Sunil Shanker, Sunnyvale, CA (US); Sean Cox, Sunnyvale, CA (US); Chi-I Lang, Sunnyvle, CA (US); Judy H. Huang, Los Gatos, CA (US); Minh Anh Nguyen, San Jose, CA (US); Ken Vo, San Jose, CA (US); Wenxian Zhu, Palo Alto, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 11/082,369

(22) Filed: Mar. 16, 2005

(51) Int. Cl.
 H01L 21/469 (2006.01)
 H01L 21/31 (2006.01)
(52) U.S. Cl. .............................. 438/788; 257/E21.547
(58) Field of Classification Search ................ 438/475, 438/530, 779, 784, 778, 706, 719, 723, 710, 438/756, 788; 257/E21.547
See application file for complete search history.

(56) References Cited

U.S. PATENT DOCUMENTS

| | | | |
|---|---|---|---|
| 4,361,461 A | 11/1982 | Chang | |
| 5,129,958 A | 7/1992 | Nagashima et al. | |
| 5,227,191 A | 7/1993 | Nagashima | |
| 5,246,885 A | 9/1993 | Braren et al. | |
| 5,252,178 A | 10/1993 | Moslehi | |
| 5,270,264 A | 12/1993 | Andideh et al. | |
| 5,282,925 A | 2/1994 | Jeng et al. | |
| 5,342,801 A | 8/1994 | Perry et al. | |
| 5,385,857 A | 1/1995 | Solo de Zaldivar | |
| 5,494,854 A | 2/1996 | Jain | |
| 5,516,729 A | 5/1996 | Dawson et al. | |
| 5,532,516 A | 7/1996 | Pasch et al. | |
| 5,621,241 A | 4/1997 | Jain | |
| 5,622,894 A | 4/1997 | Jang et al. | |
| 5,636,320 A | 6/1997 | Yu et al. | |
| 5,641,545 A | 6/1997 | Sandhu | |
| 5,702,982 A | 12/1997 | Lee et al. | |
| 5,705,419 A | 1/1998 | Perry et al. | |
| 5,711,998 A | 1/1998 | Shufflebotham | |
| 5,789,818 A | 8/1998 | Havemann | |
| 5,834,068 A | 11/1998 | Chern et al. | |
| 5,851,344 A | 12/1998 | Xu et al. | |

(Continued)

FOREIGN PATENT DOCUMENTS

JP 2003-031649 1/2003

OTHER PUBLICATIONS

U.S. Office Action mailed Nov. 17, 2005, from U.S. Appl. No. 10/316,987.

(Continued)

*Primary Examiner*—Asok Kumar Sarkar
(74) *Attorney, Agent, or Firm*—Beyer Weaver, LLP.

(57) ABSTRACT

Methods of filling gaps on semiconductor substrates with dielectric film are described. The methods reduce or eliminate sidewall deposition and top-hat formation. The methods also reduce or eliminate the need for etch steps during dielectric film deposition. The methods include treating a semiconductor substrate with a hydrogen plasma before depositing dielectric film on the substrate. In some embodiments, the hydrogen treatment is used is conjunction with a high rate deposition process.

21 Claims, 6 Drawing Sheets

U.S. PATENT DOCUMENTS

| | | | |
|---|---|---|---|
| 5,858,876 A | 1/1999 | Chew | |
| 5,869,902 A | 2/1999 | Lee et al. | |
| 5,872,058 A | 2/1999 | Van Cleemput et al. | |
| 5,897,370 A | 4/1999 | Joshi et al. | |
| 5,910,020 A | 6/1999 | Yamada | |
| 5,911,113 A | 6/1999 | Yao et al. | |
| 5,913,140 A | 6/1999 | Roche et al. | |
| 5,920,792 A | 7/1999 | Lin | |
| 5,937,323 A | 8/1999 | Orczyk et al. | |
| 5,953,635 A | 9/1999 | Andideh | |
| 5,962,923 A | 10/1999 | Xu et al. | |
| 5,963,840 A | 10/1999 | Xia et al. | |
| 5,968,610 A | 10/1999 | Liu et al. | |
| 5,972,192 A | 10/1999 | Dubin et al. | |
| 6,027,663 A | 2/2000 | Martin et al. | |
| 6,030,881 A | 2/2000 | Papasouliotis et al. | |
| 6,077,451 A | 6/2000 | Takenaka et al. | |
| 6,077,574 A | 6/2000 | Usami | |
| 6,106,678 A | 8/2000 | Shufflebotham et al. | |
| 6,124,211 A | 9/2000 | Butterbaugh et al. | |
| 6,136,703 A | 10/2000 | Vaartstra | |
| 6,149,779 A | 11/2000 | Van Cleemput | |
| 6,184,158 B1 | 2/2001 | Shufflebotham et al. | |
| 6,200,412 B1 | 3/2001 | Kilgore et al. | |
| 6,211,065 B1 | 4/2001 | Xi et al. | |
| 6,232,196 B1 | 5/2001 | Raaijmakers et al. | |
| 6,265,269 B1 | 7/2001 | Chen et al. | |
| 6,277,764 B1 | 8/2001 | Shin et al. | |
| 6,331,494 B1 | 12/2001 | Olson et al. | |
| 6,335,261 B1 | 1/2002 | Natzle et al. | |
| 6,395,150 B1 | 5/2002 | Van Cleemput et al. | |
| 6,400,023 B2 | 6/2002 | Huang | |
| 6,410,446 B1 | 6/2002 | Tsai et al. | |
| 6,451,705 B1 | 9/2002 | Trapp et al. | |
| 6,479,361 B1 | 11/2002 | Park | |
| 6,479,396 B1 | 11/2002 | Xu et al. | |
| 6,486,081 B1 | 11/2002 | Ishikawa et al. | |
| 6,500,728 B1 | 12/2002 | Wang | |
| 6,531,377 B2 | 3/2003 | Knorr et al. | |
| 6,566,229 B2 | 5/2003 | Hong et al. | |
| 6,569,777 B1 | 5/2003 | Hsu et al. | |
| 6,596,653 B2 | 7/2003 | Tan et al. | |
| 6,596,654 B1 | 7/2003 | Bayman et al. | |
| 6,599,829 B2 | 7/2003 | Smith et al. | |
| 6,617,207 B1 | 9/2003 | Kiryu et al. | |
| 6,642,105 B2 | 11/2003 | Kim et al. | |
| 6,706,541 B1 | 3/2004 | Toprac et al. | |
| 6,737,334 B2 | 5/2004 | Ho et al. | |
| 6,787,483 B1 | 9/2004 | Bayman et al. | |
| 6,794,290 B1 | 9/2004 | Papasouliotis et al. | |
| 6,808,748 B2 | 10/2004 | Kapoor et al. | |
| 6,812,043 B2* | 11/2004 | Bao et al. | 438/4 |
| 6,821,905 B2* | 11/2004 | Pan et al. | 438/706 |
| 6,846,391 B1 | 1/2005 | Papasouliotis et al. | |
| 6,846,745 B1 | 1/2005 | Papasouliotis et al. | |
| 6,867,086 B1* | 3/2005 | Chen et al. | 438/219 |
| 6,903,031 B2* | 6/2005 | Karim et al. | 438/787 |
| 6,958,112 B2 | 10/2005 | Karim et al. | |
| 7,001,854 B1 | 2/2006 | Papasouliotis et al. | |
| 2001/0019903 A1 | 9/2001 | Shufflebotham et al. | |
| 2001/0044203 A1 | 11/2001 | Huang et al. | |
| 2002/0052119 A1 | 5/2002 | Van Cleemput | |
| 2002/0084257 A1 | 7/2002 | Bjorkman et al. | |
| 2002/0179570 A1 | 12/2002 | Mathad et al. | |
| 2003/0003244 A1 | 1/2003 | Rossman | |
| 2003/0003682 A1 | 1/2003 | Moll et al. | |
| 2003/0087506 A1 | 5/2003 | Kirchhoff | |
| 2003/0165632 A1 | 9/2003 | Lin et al. | |
| 2003/0203652 A1* | 10/2003 | Bao et al. | 438/783 |
| 2003/0207580 A1 | 11/2003 | Li et al. | |
| 2004/0020894 A1 | 2/2004 | Williams et al. | |
| 2004/0058549 A1 | 3/2004 | Ho et al. | |
| 2004/0082181 A1 | 4/2004 | Doan et al. | |
| 2004/0110390 A1* | 6/2004 | Takagi et al. | 438/710 |
| 2004/0241342 A1 | 12/2004 | Karim et al. | |
| 2005/0074946 A1 | 4/2005 | Chu et al. | |
| 2005/0130411 A1* | 6/2005 | Bao et al. | 438/637 |
| 2005/0136576 A1* | 6/2005 | Ishihara et al. | 438/162 |
| 2005/0136686 A1* | 6/2005 | Kim et al. | 438/778 |
| 2005/0250346 A1* | 11/2005 | Schmitt | 438/778 |

OTHER PUBLICATIONS

Lang et al., "Strain Engineering—HDP Thin Film With Tensile Stress For FEOL and Other Applications", Novellus Systems, Inc., filed Nov. 17, 2004, U.S. Appl. No. 10/991,890, pp. 1-35.

U.S. Office Action mailed Oct. 18, 2005, from U.S. Appl. No. 10/947,424.

Lang et al., "Using Water (H2O) To Replace Oxygen (O2) In A Silicon Dioxide (SiO2) Thin Film Deposition Process for HDP STI Technology", Novellus Systems, Inc., filed Nov. 9, 2005, U.S. Appl. No. 11/272,487, pp. 1-25.

U.S. Office Action mailed Aug. 6, 2003, from U.S. Appl. No. 10/058,897.

U.S. Office Action mailed Jan. 29, 2004, from U.S. Appl. No. 10/058,897.

U.S. Office Action mailed May 21, 2004, from U.S. Appl. No. 10/058,897.

U.S. Office Action mailed Aug. 10, 2004, from U.S. Appl. No. 10/271,333.

U.S. Office Action mailed Apr. 14, 2004, from U.S. Appl. No. 10/271,333.

U.S. Office Action mailed Jun. 29, 2005, from U.S. Appl. No. 10/728,569.

Papasouliotis et al., "Hydrogen-Based Phosphosilicate Glass Process for Gap Fill of High Aspect Ratio Structures", Novellus Systems, Inc., filed Oct. 11, 2002, Appl. No. 10/271,333, pp. 1-28.

Guari et al., "Method of Preventing Structures Erosion During Multi-Step Gap Fill", Novellus Systems, Inc., filed Dec. 4, 2003, Appl. No. 10/728,569, pp. 1-29.

U.S. Office Action mailed Jan. 7, 2005, from U.S. Appl. No. 10/728,569.

U.S. Office Action mailed Nov. 6, 2002, from U.S. Appl. No. 09/996,619.

U.S. Office Action mailed Mar. 2, 2004, from U.S. Appl. No. 10/442,846.

Bayman et al., "Gap Fill For High Aspect Ratio Structures", Novellus Systems, Inc., filed Jul. 13, 2004, Appl. No. 10/890,655, pp. 1-24.

U.S. Office Action mailed Jul. 25, 2005, from U.S. Appl. No. 10/890,655.

U.S. Office Action mailed Apr. 30, 2004, from U.S. Appl. No. 10/389,164.

Sutanto et al., "Method For Controlling Etch Process Repeatability", Novellus Systems, Inc., filed Sep. 2, 2003, Appl. No. 10/654,113, pp. 1-31.

U.S. Office Action mailed Jun. 17, 2004, from U.S. Appl. No. 10/654,113.

U.S. Office Action mailed Dec. 2, 2004, from U.S. Appl. No. 10/654,113.

U.S. Office Action mailed Mar. 31, 2005, from U.S. Appl. No. 10/654,113.

Bayman et al., "Process Modulation to Prevent Structure Erosion During Gap Fill", Novellus Systems, Inc., filed Sep. 7, 2004, Appl. No. 10/935,909, pp. 1-30.

Papasouliotis et al., "Dynamic Modification of Gap-Fill Process Characteristics", Novellus Systems, Inc., filed Sep. 21, 2004, Appl. No. 10/947,434, pp. 1-25.

Hook et al., "The Effects of Fluorine on Parametrics and Reliability in a 0.18-μm $^{3.5}$/$_{8}$nm Dual Gate Oxide CMOS Technology", IEEE Transactions on Electron Devices, vol. 48, No. 7., Jul. 2001, pp. 1346-1353.

Papasoulitotis et al., "Deposition Profile Modification Through Process Chemistry", Novellus Systems, Inc., filed Dec. 9, 2002, Appl. No. 10/316,987, pp. 1-35.

U.S. Office Action mailed Jan. 27, 2005, from U.S. Appl. No. 10/316,987.

U.S. Office Action mailed Jul. 14, 2005, from U.S. Appl. No. 10/316,987.

Zhu et al., "Biased $H_2$ Etch Process In Deposition-Etch-Deposition Gap Fill", Novellus Systems, Inc., filed Dec. 10, 2003, Appl. No. 10/733,858, pp. 1-28.

U.S. Office Action mailed Apr. 19, 2005, from U.S. Appl. No. 10/733,85.

U.S. Office Action mailed Oct. 7, 2005, from U.S. Appl. No. 10/733,85.

Lang et al., "Helium-Based Etch Process in Deposition-Etch-Deposition Gap Fill", Novellus Systems, Inc., filed Jun. 22, 2005, Appl. No. 11/159,834, pp. 1-29.

U.S. Office Action mailed Dec. 14, 2005, from U.S. Appl. No. 10/728,569.

Nguyen et al., "Halogen-Free Noble Gas Assisted $H_2$ Plasma Etch Process in Deposition-Etch-Deposition Gap Fill", Novellus Systems, Inc., filed Mar. 1, 2006, U.S. Appl. No. 11/366,220.

U.S. Office Action mailed Mar. 24, 2006, from U.S. Appl. No. 10/733,858.

U.S. Office Action mailed Jun. 1, 2006, from U.S. Appl. No. 10/728,569.

U.S. Office Action mailed Apr. 19, 2006, from U.S. Appl. No. 10/947,424.

* cited by examiner

HYDROGEN TREATMENT ENHANCED GAP FILL

BACKGROUND OF THE INVENTION

This invention relates to electronic device fabrication processes. More specifically, the invention relates to chemical vapor deposition processes for forming dielectric layers in high aspect ratio, narrow width recessed features.

It is often necessary in semiconductor processing to fill a high aspect ratio gaps with insulating material. This is the case for shallow trench isolation, inter-metal dielectric layers, passivation layers, etc. As device geometries shrink and thermal budgets are reduced, void-free filling of high aspect ratio spaces (e.g., AR>3:1) becomes increasingly difficult due to limitations of existing deposition processes.

Most deposition methods deposit more material on the upper region than on the lower region of a sidewall and/or form top-hats at the entry of the gap. As a result the top part of a high aspect ratio structure sometimes closes prematurely leaving voids within the gap's lower portions. This problem is exacerbated in small features. Furthermore, as aspect ratios increase, the shape of the gap itself can contribute to the problem. High aspect ratio gaps often exhibit reentrant features, which make gap filling even more difficult. One such problematic reentrant feature is a narrowing at the top of the gap. The etched sidewalls slope inward near the top of the gap. For a given aspect ratio feature, this increases the ratio of gap volume to gap access area seen by the precursor species during deposition. Voids and seams formation is more likely under these conditions. If the top of the gap prematurely closes off, a chemical etch is required to re-open the gap before more film can be deposited in the gap.

High-density plasma chemical vapor deposition (HDP CVD) is a directional (bottom-up) CVD process that is used for high aspect ratio gap-fill. The method deposits more material at the bottom of a high aspect ratio structure than on its side-walls. It accomplishes this by directing charged dielectric precursor species downward, to the bottom of the gap. Thus, HDP CVD is not an entirely diffusion-based (isotropic) process.

Nevertheless, some overhang or top-hat formation still results at the entry region of the gap to be filled. This results from the non-directional deposition reactions of neutral species in the plasma reactor and from sputtering/redeposition processes. The directional aspect of the deposition process produces some high momentum charged species that sputter away bottom fill. The sputtered material tends to redeposit on the sidewalls. Limitations due to overhang formation become ever more severe as the width of the gap to be filled decreases and the aspect ratio increases.

Conventional HDP CVD processes rely on plasma etch steps to remove sidewall deposits and top-hats. Typically a fluorine species, such as $NF_3$, is used between dielectric film deposition steps to etch the film. After a layer of dielectric partially fills gaps on a substrate, the fluorine-containing plasma etches the layer to remove top-hats and open the gap for further deposition. However, these etch steps are time-consuming and expensive.

To improve fabrication of advanced technology devices, the art requires better dielectric deposition processes that can fill high aspect ratio features of narrow width, reduce sidewall and top-hat formation and reduce the need for etch steps during dielectric deposition.

SUMMARY OF THE INVENTION

The present invention addresses these needs by providing methods of providing improved gap-fill. The methods reduce or eliminate sidewall deposition and top-hat formation, as well as reduce or eliminate the need for etch steps during dielectric film deposition. The methods include treating a semiconductor substrate with a hydrogen plasma before depositing dielectric film on the substrate. In some embodiments, the hydrogen treatment is used is conjunction with a high rate deposition process. Applications include filling challenging structures, for example high-aspect ratio features, with dielectric film.

One aspect of the invention involves providing a substrate in a process chamber of a high density plasma chemical vapor deposition reactor, treating the substrate with a hydrogen plasma prior to any fluorine etch operation, and exposing the substrate to a process gas comprising a silicon-containing precursor to thereby grow a dielectric film via high density plasma chemical vapor deposition. The treatment and dielectric film deposition cycles may be repeated until a gap on the substrate is substantially filled.

In preferred embodiments, hydrogen treatment times range from between about 5 to 120 seconds per cycle. In a particularly preferred embodiment the hydrogen treatment times range from between 10 to 25 seconds per cycle Hydrogen gas, preferably consisting substantially of molecular hydrogen and having a flow rate between about 200 sccm–5 slm, in a particularly preferred embodiment between 1000–2000 sccm, is introduced to the reactor for the hydrogen treatment. According to various embodiments, the substrate may be biased or unbiased during hydrogen treatment.

In preferred embodiments, the substrate is exposed to the process gas for a time less than or equal to about 10 seconds. The flow rate of the silicon-containing precursor may range between about 40 sccm and 200 sccm. In a preferred embodiment the flow rate is between about 70 sccm and 100 sccm. In a particularly preferred embodiment, the flow rate is about 80 sccm.

Another aspect of the invention involves introducing multiple doses of a silicon-containing precursor gas to thereby grow a dielectric film via high density plasma chemical vapor deposition, wherein the substrate is treated with a hydrogen plasma prior to each dose and wherein the multiple doses are introduced without any intervening fluorine etch steps.

In some embodiments the method further involves, after exposing the substrate to the multiple doses, exposing the substrate to a fluorine etch and repeating the process until the gap is substantially filled. In a preferred embodiment, no more than four fluorine etch steps are required.

The methods of this invention may be used to fill high aspect ratio gaps, including gaps having aspect ratios ranging from 3:1 to 10:1.

DETAILED DESCRIPTION OF THE INVENTION

Introduction

The present invention relates to chemical vapor deposition processes that can fill high aspect ratio (typically at least 3:1), narrow width gaps with significantly reduced sidewall and top-hat formation. The deposition processes described involve treating a semiconductor substrate with a hydrogen plasma prior to depositing dielectric film on the substrate. The processes of the present invention reduce or eliminate the need for fluorine etch steps and provide improved control of the process and uniformity of the deposited film.

Although the present invention is described below in the context of high density plasma chemical vapor deposition (HDP CVD) gap fill, the invention is not so limited and maybe used with other dielectric film deposition techniques. The methods may be used in conjunction with other HDP CVD film processes, for example, depositing highly tensile stress silicon oxide films as described in U.S. patent application Ser. No. 10/991,890, hereby incorporated by reference for all purposes.

Most deposition methods either deposit more material on the upper region than on the lower region of a sidewall or form cusps (also called top-hats) at the entry of the gap. As indicated above, conventional HDP CVD gap fill result in less sidewall and top-hat formation than isotropic processes. Nevertheless, some top-hat formation and overhang still results at the entry region of the gap to be filled.

To remove sidewall and top-hat deposits and keep the gap open for further deposition, conventional HDP CVD processes typically use a multi-cycle deposition process—etch process. Each cycle includes a deposition step followed by an etch step Typically, fluorine species are used in the etch step. These fluorine etch steps are costly and time-consuming, in some cases requiring multiple reactors.

The methods of the present invention provide improved gap-fill control and uniformity and reduce sidewall and top-hat deposition. In addition, the methods of the present invention also reduce or eliminate etch steps following deposition of a dielectric film. Methods of the present invention may also reduce or eliminate intervening etch steps between successive doses of a silicon-containing process gas. The methods of the present invention are particularly useful to eliminate the need fluorine-based etches (e.g. with $F_2$, $CF_4$, $C_2F_6$, or other fluorine containing species) as well as other aggressive etch chemistries such as helium-based etches.

Process

Figure 1:
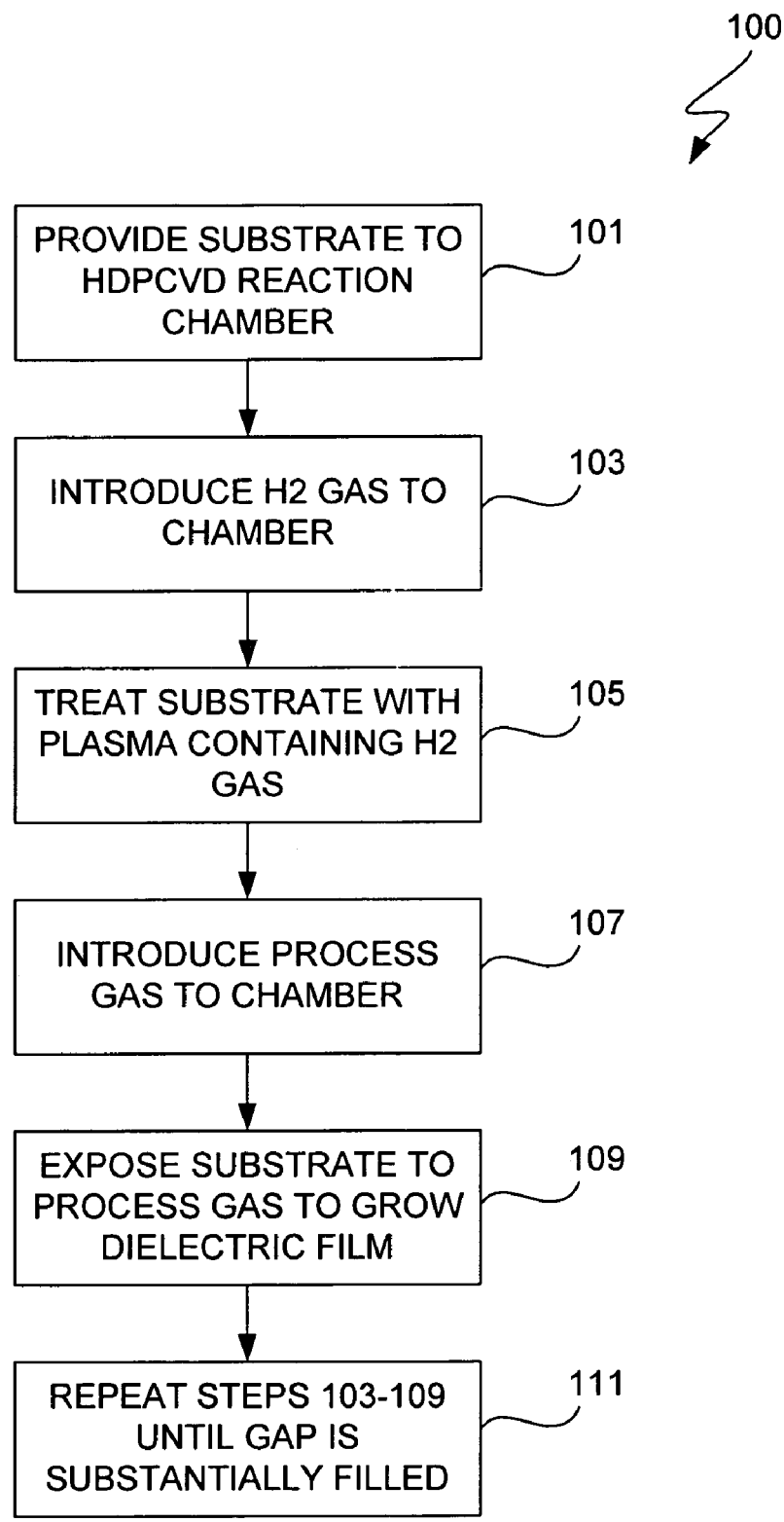
FIG. 1 is a process flow diagram depicting a method according to one embodiment of the invention.

FIG. 1 is a process flow sheet depicting a method according to one embodiment of the present invention. As shown, a deposition process 100 begins at operation 101 in which a substrate containing a gap is provided to a reaction chamber, such as a HDP CVD reaction chamber. Providing the substrate to the reactor may involve clamping the substrate to a pedestal or other support in the chamber. For this purpose, an electrostatic or mechanical chuck may be employed.

After the substrate is provided to the reaction chamber, a hydrogen gas is introduced in operation 103. The substrate is then treated with a hydrogen plasma in operation 105. Treatment with a hydrogen plasma involves ionizing the gas to form a plasma and exposing the substrate to the plasma-containing gas for a period of time. In a preferred embodiment, the treatment gas does not include gases other than hydrogen. Treatment times may vary depending on the application, with a typical time between 10 and 20 seconds.

After the substrate has been treated with a hydrogen plasma, a process gas is introduced at operation 107. The process gas includes dielectric precursor species such as high vapor pressure silicon-containing compounds. The gas may also include one or more dopant precursors. Molecular oxygen or another oxygenated compound will often be present. Sometimes, though not necessarily, an inert carrier gas is present.

The substrate is then exposed to the process to thereby grow a dielectric film by HDP CVD at operation 109. To deposit the dielectric film, the process gas is ionized to form a plasma and a bias is applied to the substrate to direct charged precursor species from the plasma onto the substrate and grow a dielectric film in the gap. The substrate is exposed to the process gas for a time to grow a substantially void free dielectric film in the gap.

After the dielectric film has been grown in the gap, steps 103–109 are then repeated until the gap is substantially filled at operation 111.

Figure 2A:
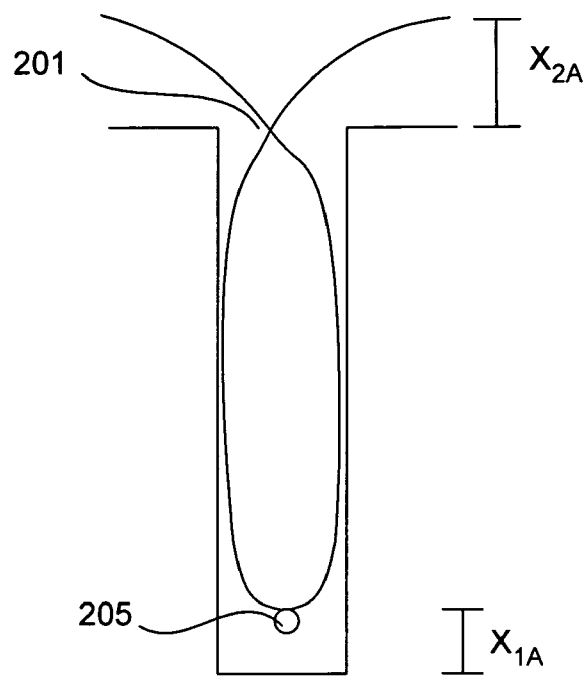
FIG. 2A is a rough schematic cross-sectional diagram of a trench partially filled without hydrogen treatment.
Figure 2B:
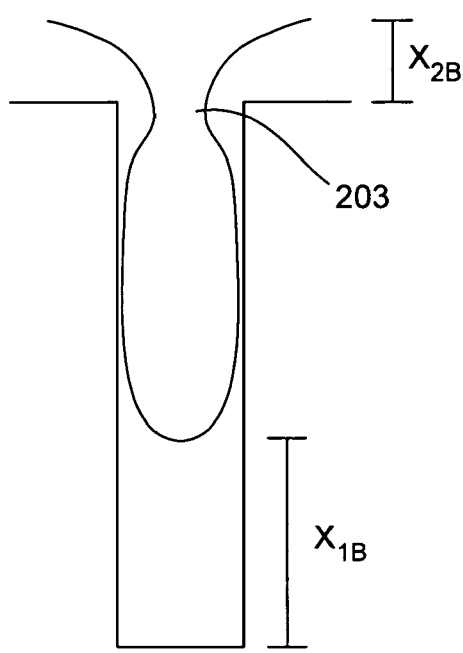
FIG. 2B is a rough schematic cross-sectional diagram of a trench partially filled according to one embodiment of the present invention.

FIGS. 2A and 2B demonstrate the improved gap fill that the methods of the present invention provide. FIGS. 2A and 2B are rough schematic cross-sectional diagrams of partially filled trenches. FIG. 2A shows deposition of silicon oxide in a trench without hydrogen treatment and FIG. 2B shows deposition of silicon oxide in a trench that was treated with hydrogen.

Two measurements are shown for each trench: the thickness of the dielectric film deposited in the bottom of the trench, $X_1$, and the thickness of the film deposited at the top of the trench, $X_2$. Large $X_1$ values (indicating good bottom up fill) and small $X_2$ values (indicating low top-hat formation) are desirable. It is also instructive to compare $X_1/X_2$, i.e. the trench fill to top-hat formation ratio of each process.

Several important differences may be observed in the trenches shown in FIGS. 2A and 2B. First, the treated trench shows more dielectric deposited at the bottom of the trench.

Hydrogen treatment has been observed to increase the bottom thickness $X_{1B}$ as much as almost twice that over that of the untreated substrate. Second, hydrogen treatment decreases the top thickness $X_2$. In some cases, hydrogen treatment has been shown to result in an $X_1/X_2$ of greater than 1, indicating that more film was deposited in the trench than at the top of the trench.

Hydrogen treatment enables the trench shown in FIG. 2B to remain open longer than the untreated substrate in FIG. 2B. As can be seen at point 203, the trench in FIG. 2B is open while the trench in FIG. 2A has closed at point 201. Because the trench in FIG. 2A is closed, a chemical etch is required to open the trench before dielectric film can be deposited in it. No such etch is required for the trench in FIG. 2B.

Hydrogen treatment also results in a better fill, with less likelihood of developing a weak spot. The trench in FIG. 2A contains a weak spot 205. The weak spot forms as a result of the increased gap volume to gap access area for the silicon-containing precursor. Weak spots can lead to formation of voids and seams. Hydrogen treatment has also been shown to result in less film deposited on the sidewall of the trench.

Figure 3:
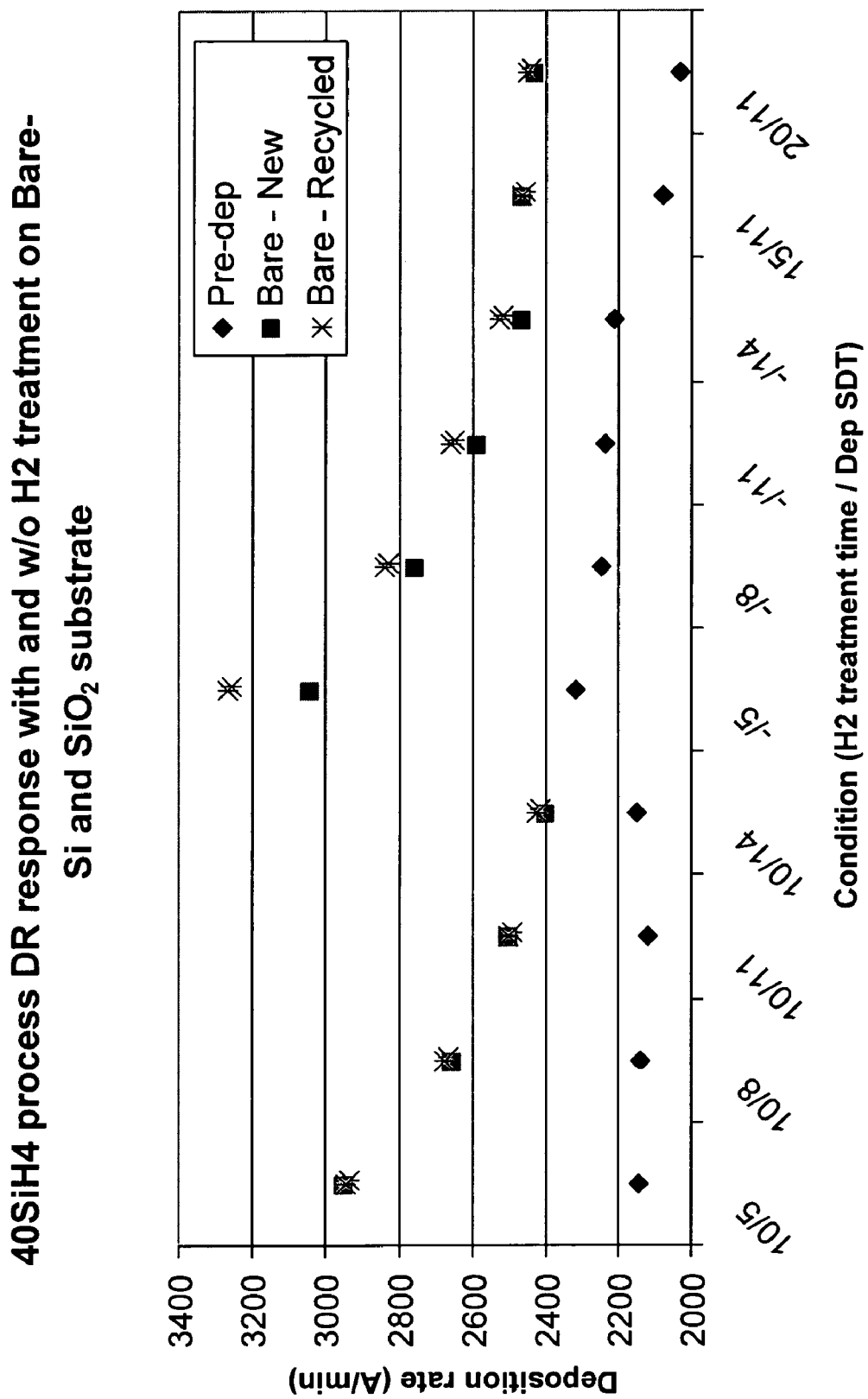
FIG. 3 is a graph depicting deposition rates as a function of hydrogen treatment time and deposition time for bare and $SiO_2$-containing substrates.

Without being bound by a particular theory, it is believed that hydrogen treatment temporarily inhibits oxide nucleation. FIG. 3 is a graph showing deposition rate as a function of hydrogen treatment time and deposition time (SDT) for 40 sccm $SiH_4$ deposited on bare silicon substrates and substrates containing a layer of silicon oxide. Both new and recycled bare substrates were tested.

The results show that deposition rates on untreated substrates are higher than for treated substrates. For example, for a deposition time of 11 seconds, deposition rate on an untreated substrate ($H_2$ treatment time=0) is over 2200 Å/min for the $SiO_2$ substrate and over 2600 Å/min for both new and recycled bare substrates. Increasing hydrogen treatment time to 10 seconds lowers the deposition rate by about 100 Å/min so that it is close to 2100 Å/min for the $SiO_2$ substrate and 2500 Å/min for both bare substrates.

It is interesting to note that there is a deviation in deposition rate between the new and recycled untreated substrates that disappears when the substrates are treated. For example, for a deposition time of 5 seconds, the deposition rate for an untreated new substrate is about 200 Å/min higher than that for an untreated recycled substrate. However, treating the substrates for 10 seconds with hydrogen results in the same deposition rate for the new and recycled substrates. This indicates that the hydrogen plasma treatment results in a more uniform deposition process across new and recycled substrates.

As noted above, without being bound to a particular theory, it is believed that the decrease in deposition rate for treated substrates is a result of the hydrogen plasma inhibiting oxide nucleation at the surface of the substrate. It is believed that the superior gap fill shown in FIG. 2B is a result of this inhibition. Because the deposition of dielectric film is inhibited at the top of the trench, there is less top-hat formation and opportunity for the trench to prematurely close off.

As the hydrogen treatment time is increased, the marginal reduction in deposition rate decreases. For example, for a deposition time of 11 seconds on a new substrate, treatment times of 0, 10, 15 and 20 seconds result in deposition rates of approximately 3000, 2500, 2450 and 2400 Å/min. It is believed that the diminishing marginal reduction in deposition rates indicates that the theorized nucleation-inhibition effect of the hydrogen plasma is temporary.

In some embodiments, a high deposition rate process is used to take optimize the temporary inhibition effect. A high flow rate of dielectric precursor is used to increase the deposition rate and the amount of dielectric film deposited during the temporary nucleation inhibition. For example, a 80 sccm $SiH_4$/4500 Å/min process has been shown to result in a smaller top-hat than formed during a 40 sccm $SiH_4$/2200 Å/min process.

Figure 4:
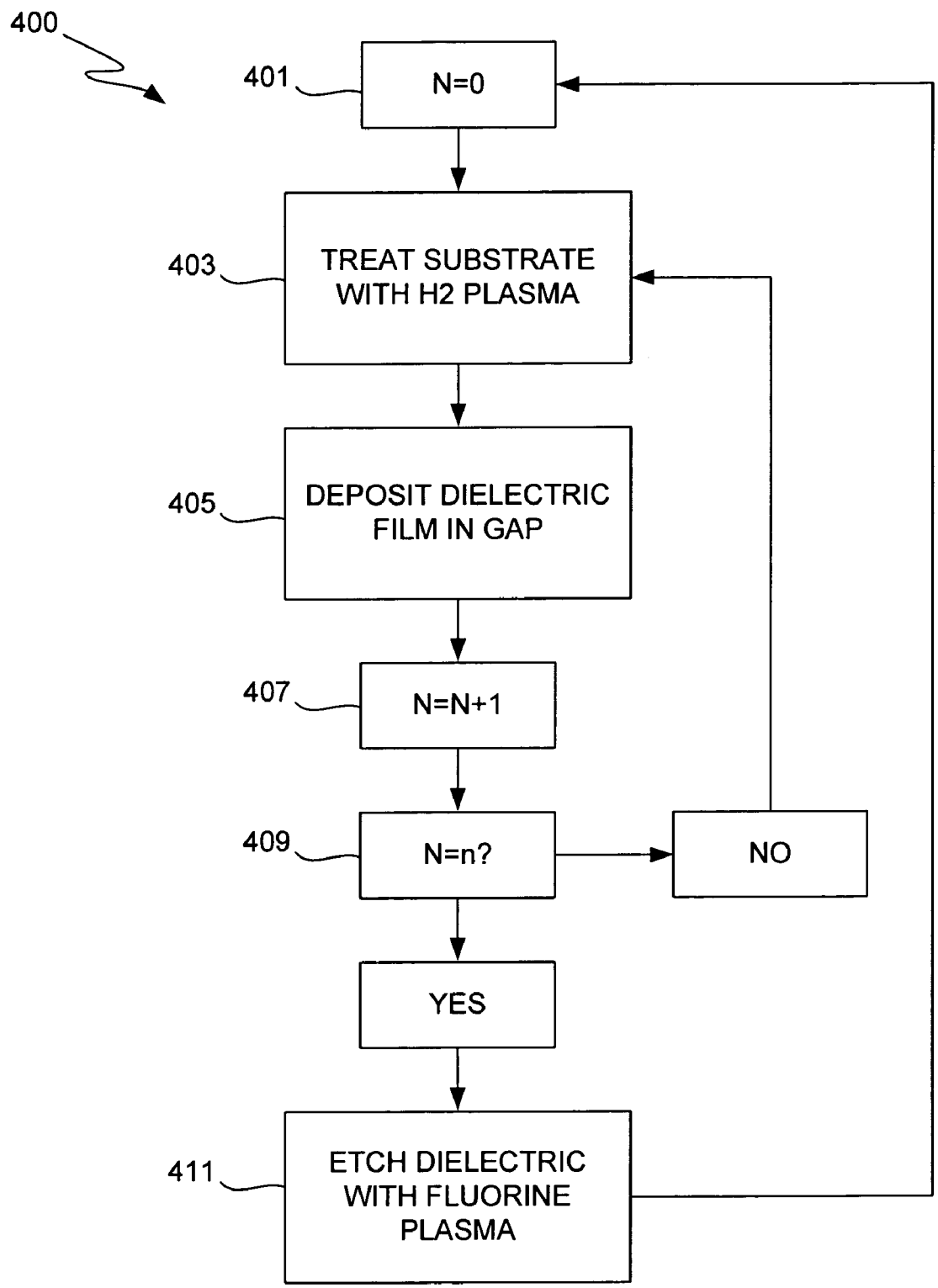
FIG. 4 is a process flow diagram depicting a method according to one embodiment of the invention.

As discussed above, conventional HDP CVD gap filling methods require chemical etch steps aimed at opening the gap and removing sidewall deposits. Some embodiments of the present invention provide methods of depositing dielectric film on substrates and/or filling gaps that do not require chemical etch steps. In other embodiments of the present invention, chemical etch steps may be used but only after multiple deposition cycles. For example, a process may include n hydrogen treatment and deposition steps, followed by a chemical etch step, which then may be followed by another n hydrogen treatment and deposition steps, etc. In this manner, the number of chemical etch steps is reduced by a factor of n. A flow sheet illustrating this process according to one embodiment of the invention is shown in FIG. 4.

Process 400 begins at operation 401 where a counter N is set to zero. A substrate is treated with a plasma-containing hydrogen gas at operation 403. Treatment with a plasma-containing hydrogen gas is described above with respect to FIG. 1. Dielectric film is then deposited on the substrate at operation 405. Deposition of dielectric film is also discussed above with respect to FIG. 1. Counter N is increased by one and compared to n in operations 407 and 409. If the counter is not equal to n, operations 403–407 are repeated. Thus, the hydrogen treatment-deposition cycle is then repeated n times without an etch step. After the nth hydrogen treatment-deposition cycle, the dielectric film is etched with a fluorine plasma at operation 411. For example, n may be 2, 3, 4, 5, 6, etc. In preferred embodiments, n is an integer between 2 and 10.

Apparatus

The present invention may be implemented in a HDP CVD reactor. Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In a preferred embodiment, hydrogen treatment and silicon oxide deposition occur in one reactor. In other embodiments, a wafer undergoing treatment and silicon oxide deposition is transferred from one station to another within the reactor during the process. While in process, each wafer is held in place by a pedestal, wafer chuck and/or other wafer holding apparatus. For certain operations in which the wafer is to be heated, the apparatus may include a heater such as a heating plate. An examples of a suitable reactor is the Speed™ reactor, available from Novellus Systems of San Jose, Calif.

Figure 5:
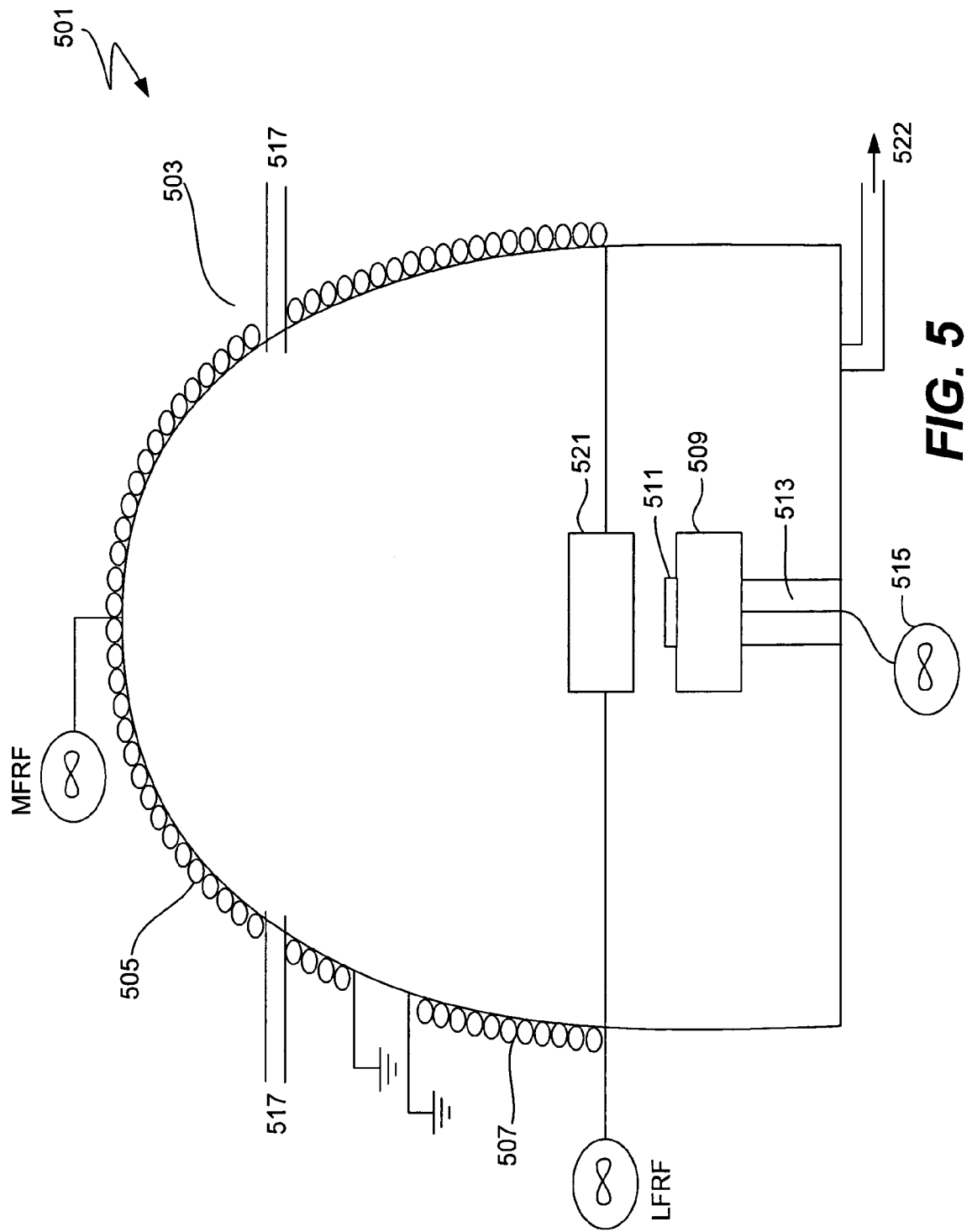
FIG. 5 is a block diagram depicting some components of a suitable CVD reactor for performing HDP CVD in accordance with this invention.

FIG. 5 provides a simple block diagram depicting various reactor components arranged as may be arranged in a conventional reactor. As shown, a reactor 501 includes a process chamber 503 which encloses other components of the reactor and serves to contain the plasma. In one example, the process chamber walls are made from aluminum, aluminum oxide, and/or other suitable material. The embodiment shown in FIG. 5 has two plasma sources: top RF coil 505 and side RF coil 507. Top RF coil 505 is a medium frequency or MFRF coil and side RF coil 507 is a low frequency or LFRF coil. In the embodiment shown in FIG. 5, MFRF frequency may be from 430–470 kHz and LFRF frequency from 340–370 kHz. However, the invention is not limited to operation in reaction chambers with dual sources, nor RF plasma sources. Any suitable plasma source or sources may be used.

Within the reactor, a wafer pedestal 509 supports a substrate 511. The pedestal typically includes a chuck (sometimes referred to as a clamp) to hold the substrate in place during the deposition reaction. The chuck may be an electrostatic chuck, a mechanical chuck or various other types of chuck as are available for use in the industry and/or research. A heat transfer subsystem including a line 513 for supplying heat transfer fluid controls the temperature of substrate 511. The wafer chuck and heat transfer fluid system can facilitate maintaining the appropriate wafer temperatures.

A high frequency RF of HFRF source 515 serves to electrically bias substrate 511 and draw charged precursor species onto the substrate for the deposition reaction. Electrical energy from source 515 is coupled to substrate 511 via an electrode or capacitive coupling, for example. Note that the bias applied to the substrate need not be an RF bias. Other frequencies and DC bias may be used as well.

The process gases are introduced via one or more inlets 517. The gases may be premixed or not. Preferably, the process gas is introduced through a gas supply inlet mechanism including orifices. In some embodiments, at least some of the orifices orient the process gas along an axis of injection intersecting an exposed surface of the substrate at an acute angle. Further, the gas or gas mixtures may be introduced from a primary gas ring 521, which may or may not direct the gases toward the substrate surface. Injectors may be connected to the primary gas ring 521 to direct at least some of the gases or gas mixtures into the chamber and toward substrate. Note that injectors, gas rings or other mechanisms for directing process gas toward the wafer are not critical to this invention. The sonic front caused by a process gas entering the chamber will itself cause the gas to rapidly disperse in all directions—including toward the substrate. Process gases exit chamber 503 via an outlet 522. A vacuum pump (e.g., a turbomolecular pump) typically draws process gases out and maintains a suitably low pressure within the reactor.

Process Parameters

Hydrogen Treatment Parameters

Gas

In a preferred embodiment, hydrogen gas is introduced to the reactor to create the plasma-containing hydrogen gas consists substantially of molecular hydrogen. As discussed above, it is believed that hydrogen treatment temporarily inhibits oxide nucleation at the substrate surface. Without being bound by a particular theory, it is believed that it is the presence of $H_2$ radicals in the plasma that causes this anti-nucleation effect. It is undesirable to have heavier atoms in the plasma, as they may result in sputtering.

Flow Rate

The hydrogen gas may be introduced to the chamber at any suitable flow rate. In some embodiments, the flow rate of the hydrogen is relatively high. As mentioned above, it is believed that the $H_2$ radicals in the plasma cause the temporary inhibition effect. Having a low power, high flow rate plasma results in more $H_2$ radicals in the plasma. Thus, in a preferred embodiment for a 200 mm wafer, the flow rates ranges between about 500 sccm and 5 slm. In a particularly preferred embodiment, the flow rate is about 1500 sccm.

Plasma Source Power

The plasma source power should be high enough to sustain a plasma and low enough so that the effect of the $H^+$ ions does not overwhelm that of the $H_2$ radicals. Note that preferred RF power will depend on the substrate size (e.g., 200 or 300 mm diameter wafer) and the requirements of the specific process being used. A preferred range is between about 3000 W and 6000 W. In a preferred embodiment using the dual RF plasma source described above for a 200 mm wafer, the power of each of the LFRF and MFRF plasma sources should be between 1500 W and 5000 W. In a particularly preferred embodiment, the power of each source is 2500 W.

Temperature and Pressure

Substrate temperature and chamber pressure during hydrogen treatment are generally with the ranges commonly used during HDP CVD processes. Temperature values may range from about 200° C. and 1000° C. A preferred range during hydrogen treatment is between about 400° C. and 550° C. and a particularly preferred range is between about 480° C. and 500° C. Pressure is preferably maintained at a value below 500 mTorr, more preferably between about 5 and 500 mTorr.

Time

Hydrogen treatment time should be long enough to achieve a stable plasma within the reactor. Note that preferred treatment time will depend on the substrate size (e.g., 200 or 300 mm diameter wafer) and the requirements of the specific process being used. In a preferred embodiment, the substrate is exposed to hydrogen for at least ten seconds. Though the treatment time may vary between 5–120 sec, it may be desirable to limit hydrogen treatment time to achieve high throughput in an industrial process. In another preferred embodiment, the substrate is exposed to hydrogen for a time ranging from about 10–25 seconds. In a particularly preferred embodiment, the substrate is exposed to hydrogen for a time ranging from about 10–20 seconds.

Substrate

The substrate may be any suitable substrate, typically a semiconductor wafer. Typical substrates are 200 mm or 300 mm silicon wafers. It should be noted that unless otherwise noted, process parameters given are specific to a 200 mm wafer, but one of skill in the art would understand how to adjust these parameters to process a 300 mm wafer.

In some embodiments, the substrate provided to the chamber is bare. For the purposes of this application, bare substrates are semiconductor substrates that do not contain heterogeneous layers of material on the semiconductor material. In some embodiments, the bare substrate may be a new substrate, i.e. a semiconductor substrate that has not undergone previous processing. In some embodiments, the bare substrate may be recycled, i.e. a semiconductor substrate that has been stripped and substantially cleaned of any material other than the semiconductor. In some embodiments, the semiconductor substrate may include a SiN liner layer but no dielectric material. In some embodiments, the substrate includes a dielectric layer. For example, in a process with multiple $H_2$ treatment-deposition cycles, the substrate will have dielectric material already deposited on it during every $H_2$ treatment operation after the first treatment.

As discussed earlier, while the invention may be practiced on any substrate in which it is desirable to achieve a reduced deposition rate, it is particularly applicable to filling high aspect ratio gaps. This is because the reduced deposition rate may be preferentially achieved at the top of the trench or other gap, where deposition is not desirable while leaving deposition at the bottom of the trench unaffected. The invention is particularly useful for gaps having aspect ratios ranging from 3:1 to 7:1.

Substrate Bias

A HFRF power source or other source may be used to bias the substrate. Substrates are typically biased during deposition and etch operations to direct charged species downward, to the bottom of the gap. As discussed above, it is believed that the hydrogen treatment improves gap fill by temporarily inhibiting oxide nucleation at the top of the gap during the subsequent deposition operation. Thus, it is believed that the mechanism of the hydrogen treatment in improving gap fill is the effect of $H_2$ radicals on the substrate surface. The hydrogen plasma treatment does not cause significant material removal, with etch rates around 40 Å/min for a 300 mm wafer. Thus, in some embodiments, the substrate is unbiased during hydrogen treatment.

Figure 6A:
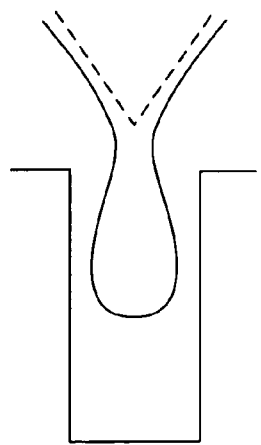
FIG. 6A is a rough schematic cross-sectional diagram of a trench partially filled using an unbiased substrate during hydrogen treatment according to one embodiment of the present invention.
Figure 6B:
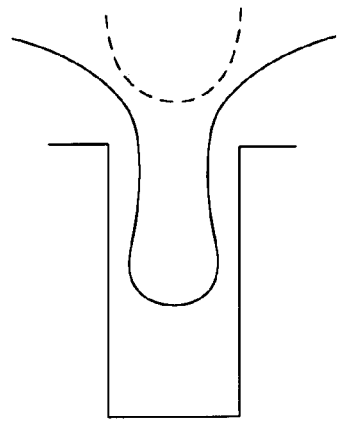
FIG. 6B is a rough schematic cross-sectional diagram of a trench filled partially using a biased substrate during hydrogen treatment according to one embodiment of the present invention.

In some embodiments, the substrate is biased during hydrogen treatment. Although it is believed that the important mechanism of the hydrogen treatment is the effect of $H_2$ radicals at the top of the gap, it has been found in some embodiments, a small bias may improve gap fill. FIGS. 6A and 6B are rough schematic diagrams of a trenches partially filled with dielectric film according to embodiments of the invention. FIG. 6A shows the result where a substrate is unbiased and FIG. 6B, the result obtained using a biased substrate. Both methods obtain good void-free gap-fill. However, as indicated by the dotted lines, the profile at the top of the trench in FIG. 6a is more of a V-shape whereas FIG. 6B shows more of a U-shaped profile. Adding the bias has been shown to further reduce top-hat formation.

It is believed that the application of bias power helps keeps the gap open and further lower top-hats by a mechanical etch effect. The etch rate is very low, around 0 Å/min, enough to remove a small amount of film and lower the top-hats.

The HF bias power is preferably between about 0 W and 5000 W for a 200 mm wafer and 3000 W and 10000 W for a 300 mm system. A particularly preferred power for the 200 mm is about 3000 W. The bias power may need to be balanced with the treatment time in order to prevent too much film from being etched.

Deposition Parameters

Gas

The components of the process gas should be chosen to produce the composition of the dielectric to be deposited. As is known to those of skill in the art, many suitable precursor gases are widely available, some of which include both a source of silicon and oxygen. Examples of suitable silicon-containing precursor molecules include the following: silane ($SiH_4$), $Si_2H_6$, TEOS (tetraethyl orthosilicate), TMCTS (tetramethyl-cyclotetrasiloxane), OMCTS (octamethyl-cyclotetrasiloxane), methyl-silane, dimethyl-silane, 3MS (trimethylsilane), 4MS (tetramethylsilane), TMDSO (tetramethyl-disiloxane), TMDDSO (tetramethyl-diethoxyl-disiloxane), DMDMS (dimethyl-dimethoxyl-silane) and mixtures thereof. During deposition, the process decomposes the silicon-containing reactant to form a silicon-containing gas and plasma phase species, which can react on the surface of the substrate.

Examples of suitable oxygen-containing precursor molecules include the following: oxygen, nitric oxide (NO), and nitrous oxide ($N_2O$).

For doped dielectrics, the process gas may include a dopant precursor such as a boron-containing gas, a phosphorus-containing gas, or a mixture thereof.

Often, the process gas employed for deposition will also include a carrier gas such as helium or argon. Still other process gases such as nitrogen, ammonia, and lower hydrocarbons (such as methane, ethylene, and acetylene) may be employed depending on the composition of the dielectric to be deposited.

Flow Rate

Flow rate of the silicon-containing precursor gas typically ranges from about 40–200 sccm. As discussed above, in preferred embodiments, the flow rate is high to achieve a high deposition rate process. The purpose of the high deposition rate process is to deposit film during the duration of the temporary nucleation inhibition caused by the hydrogen treatment. Thus, in a preferred embodiment the flow rate of the silicon-containing precursor gas is between about 70 and 100 sccm. For silane, a flow rate of about 80 sccm is particularly preferred.

Time

Deposition time should generally not exceed the period that the anti-nucleation effect is present. In a preferred embodiment, the deposition time is not greater than about 10 seconds.

Temperature and Pressure

Substrate temperature and chamber pressure during hydrogen treatment are generally with the ranges commonly used during deposition operations in HDP CVD processes. The temperature of the substrate within the process vessel should be maintained sufficiently high to ensure that the dielectric deposition reaction proceeds efficiently. Hence, the temperature preferably resides at values between about 200 and 1000° C. and more preferably between about 450 and 750° C. In particularly preferred embodiments, the substrate temperature is maintained between about 480 and 650° C. For deposition, the pressure within the reactor during HDP CVD is typically maintained at a level no greater than about 100 mTorr, more preferably between about 1.5 and 30 mTorr.

Plasma Source and Bias Power

The high frequency electrode (for biasing the substrate) preferably generates a power of between about 0.2 and 10 kiloWatts during deposition, more preferably between about 0.5 and 5 kilowatts. For many deposition reactions suitable for this invention, the total power of the LF and MF sources (i.e. MF+LF) ranges from 2 kW to 10 kW for a 200 mm system and 2 kW to 1300 kW for a 300 mm system. In preferred embodiments, the LF power is greater than the MF power. The LF/MF power split is tuned to obtained good, uniform gap fill from center to edge.

Experimental

The following examples provide details illustrating aspects of the present invention. These examples are provided to exemplify and more clearly illustrate these aspects of the invention and are in no way intended to be limiting.

EXAMPLE 1

Dielectric film was deposited on bare (new and recycled) wafers and pre-deposited wafers containing a layer of at least 2000 Å of $SiO_2$ film. The following process parameters were used:

| Parameter | $H_2$ Treatment | Deposition |
|---|---|---|
| Injection | Twin injection | Twin injection |
| Silane flow rate, sccm | 0 | 40 |
| Oxygen flow rate, sccm | 0 | 65 |
| Helium flow rate, sccm | 0 | 250 |
| Hydrogen flow rate, sccm | 1800 | 490 |
| $NF_3$, sccm | 0 | 0 |
| LFRF (side coil), W | 2500 | 4500 |
| MFRF (top coil), W | 2500 | 4500 |
| HFRF (bias), W | 0 | 1800 |
| Pedestal - distance from gas ring, inches | 1.5 | 3.75 |

Deposition rates were found as functions of various hydrogen treatment times and deposition times (SDTs). The results are shown in FIG. 3 and discussed above. It should be noted that although pedestal distance from the gas ring was 1.5", additional testing has shown that a pedestal distance of 3.75" (i.e. the same used during deposition) also works well.

EXAMPLE 2

Dielectric film was deposited on treated and untreated 200 mm wafers using a SPEED-NExT chamber, available from Novellus Systems of San Jose, Calif. For both processes, $SiH_4$ flow rate was 40 sccm and deposition rate was approximately 2200 Å/min.

For the untreated substrate, a thickness of 2000 Å deposited film was targeted. A single step deposition with an SDT of 57 seconds was used. No etch steps were used.

For the treated substrate, a thickness of 2500 Å deposited film was targeted. 5 cycles of 40 sccm $SiH_4$ were used with an SDT of 14 seconds. No etch steps were used. $H_2$ flow rate was 1500 sccm and treatment time was 10 seconds. The substrate was unbiased during treatment.

Figure 7A:
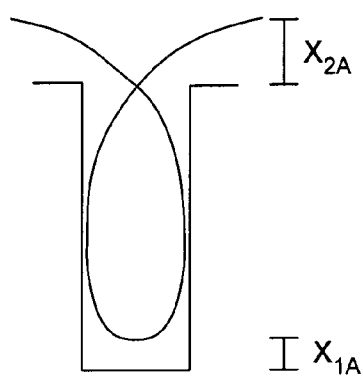
FIG. 7A is a rough schematic cross-sectional diagram of a trench partially filled using a 40 sccm Si-containing process gas without hydrogen treatment.
Figure 7B:
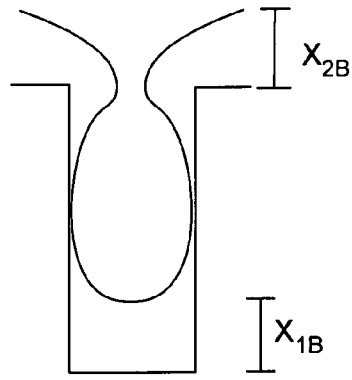
FIG. 7B is a rough schematic cross-sectional diagram of a trench partially filled using a 40 sccm Si-containing process gas according to one embodiment of the present invention.

FIGS. 7A and 7B are rough schematic diagrams of the partially filled trenches after deposition; FIG. 7A shows the results obtained without hydrogen treatment and FIG. 7B with hydrogen treatment. The bottom thickness of the trench in FIG. 7A is less than that in FIG. 7B. In addition, FIG. 7A shows that the trench closed off preventing any further deposition in the trench. FIG. 7B shows that hydrogen treatment, the trench just beginning to close at the target thickness of 2500 Å, despite having a greater target thickness than for the untreated condition.

Bottom thickness $X_1$ and top thickness $X_2$ for the treated and untreated conditions are shown below:

| Process | Bottom Thickness $X_1$ (Å) | Top Thickness, $X_2$ (Å) | $X_1/X_2$ |
|---|---|---|---|
| 40 $SiH_4$ no treatment | 855 | 1710 | 0.50 |
| 40 $SiH_4$ $H_2$ treatment | 1582 | 1881 | 0.84 |

$H_2$ treatment resulted in a bottom thickness almost twice that obtained without $H_2$ treatment. The relatively higher top thickness for the treated condition is a result of targeting a higher thickness (2500 Å) than was targeted for the untreated condition (2000 Å). Targeting a higher thickness for the untreated run would have increased the top-hat formation without increasing the bottom thickness because as shown in FIG. 7A, the top of the trench had already closed off preventing further deposition in the trench. The ratio of bottom to top thickness is particularly improved for the $H_2$ treated process.

EXAMPLE 3

Dielectric film was deposited on treated and untreated 200 mm wafers using a SPEED-NExT chamber, available from Novellus Systems of San Jose, Calif. For both processes, $SiH_4$ flow rate was 80 sccm and deposition rate was approximately 4500 Å/min.

For the untreated substrate, a thickness of 2000 Å deposited film was targeted. A single step deposition with an SDT of 27 seconds was used. No etch steps were used.

For the treated substrate, a thickness of 2500 Å deposited film was targeted. 5 cycles of 80 sccm $SiH_4$ were used with an SDT of 6 seconds. $H_2$ flow rate was 1500 sccm and treatment time was 10 seconds. The substrate was unbiased during treatment. No etch steps were used.

Figure 8A:
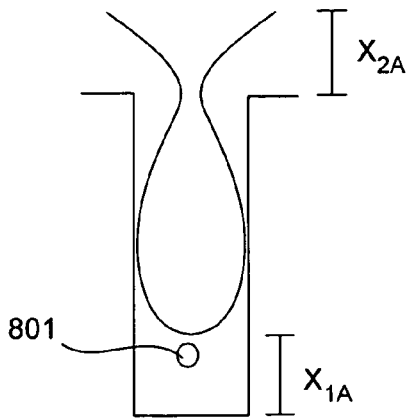
FIG. 8A is a rough schematic cross-sectional diagram of a trench partially filled using a 80 sccm Si-containing process gas without hydrogen treatment.
Figure 8B:
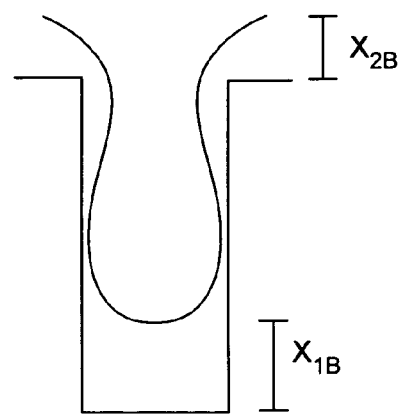
FIG. 8B is a rough schematic cross-sectional diagram of a trench partially filled using a 80 sccm Si-containing process gas according to one embodiment of the present invention.

FIGS. 8A and 8B are rough schematic diagrams of the partially filled trenches after deposition; FIG. 8A shows the results obtained without hydrogen treatment and FIG. 8B with hydrogen treatment. The bottom thickness of the trench in FIG. 8A is slightly less than that in FIG. 8B. In addition, FIG. 8A shows that the trench is almost closed off. FIG. 8B shows that for the hydrogen treated condition, the trench is still open. In addition, the untreated condition resulted in formation of a weak spot 801 in the trench.

Bottom thickness $X_1$ and top thickness $X_2$ for the treated and untreated conditions are shown below in Table 1:

| Process | Bottom Thickness $X_1$ (Å) | Top Thickness, $X_2$ (Å) | $X_1/X_2$ |
|---|---|---|---|
| 80 $SiH_4$ no treatment | 1518 | 1652 | .90 |
| 80 $SiH_4$ $H_2$ treatment | 1540 | 1451 | 1.06 |

As shown in FIG. 8B, the trench still open indicates that a higher thickness could be obtained using hydrogen treatment whereas the closed off trench for the untreated condition would prevent more fill. In addition, $H_2$ treatment resulted in more film deposited in the trench than at the top of the trench.

The 80 sccm $SiH_4$ treated process also resulted in less top-hat formation than the 40 sccm $SiH_4$ process, with 1451 Å for the 80 sccm process and 1881 Å for the 40 sccm process. (The bottom thickness results are not readily comparable as the trenches had different dimensions.) This result indicates that the hydrogen treatment is preferably used with a high deposition rate process, as discussed above.

EXAMPLE 4

Dielectric film was deposited on treated and untreated 200 mm wafers using a SPEED-NExT chamber, available from Novellus Systems of San Jose, Calif. For both processes, SiH$_4$ flow rate was 80 sccm. Targeted thickness was identical for both conditions. Deposition were performed with low bias (Sputter/Deposition ratio was approximately 0.039).

For the untreated condition, film was deposited in one 30 second deposition cycle. For the treated condition, film was deposited in three 10 second deposition cycle. Each deposition was preceded by 20 seconds of H$_2$ treatment.

1290 Å of film was deposited in the bottom of the trench using H$_2$ treatment, compared to 1021 Å for the untreated substrate. In addition top-hat formation was observed to be less for the treated substrate. The low S/D ratio indicates that this reduction in top-hat formation is due to H$_2$ treatment and not deposition bias.

EXAMPLE 5

Dielectric film was deposited on a 200 mm wafer using a SPEED-NExT chamber, available from Novellus Systems of San Jose, Calif. Film was deposited after 17 seconds of hydrogen treatment. A bias of 3000 W was applied to the wafer during hydrogen treatment.

Good fill and a trench profile substantially similar to that shown in FIG. 6B was achieved. Bottom up fill was comparable to that achieved without bias power, while top-hat formation was reduced. The results indicate that the application of bias power does not affect H$_2$ treatment of the surface and that the low (~100 Å/min) etch rate of the H$^+$ ions is sufficient to lower top-hats and help keep the trench open.

While this invention has been described in terms of a few preferred embodiments, it should not be limited to the specifics presented above. Many variations on the above-described preferred embodiments, may be employed. Therefore, the invention should be broadly interpreted with reference to the following claims.

What is claimed is:

1. A method of filling a gap on a semiconductor substrate, the method comprising:
    (a) providing a substrate having a gap in a process chamber of a high density plasma chemical vapor deposition reactor;
    (b) prior to any fluorine etch operation, treating the substrate with a hydrogen plasma; and
    (c) exposing the substrate to a process gas comprising a silicon-containing precursor, to thereby grow a dielectric film in the gap via high density plasma chemical vapor deposition.

2. The method of claim 1, further comprising repeating steps (b) and (c) until the gap is substantially filled.

3. The method of claim 1, wherein treating the substrate with a hydrogen plasma comprises exposing the substrate to a plasma-containing hydrogen gas for a time ranging from about 10–120 seconds.

4. The method of claim 1, wherein treating the substrate with a hydrogen plasma comprises introducing hydrogen gas of having a flow rate between about 500 sccm–5 slm to the reactor.

5. The method of claim 4, wherein the flow rate is about 1500 sccm.

6. The method of claim 5, wherein the bias applied is about 3000 W.

7. The method of claim 1, wherein exposing the substrate to a process gas comprises exposing the substrate for a time less than or equal to about 10 seconds.

8. The method of claim 1, wherein treating the substrate with a hydrogen plasma comprises applying a bias to the substrate.

9. The method of claim 1, wherein the flow rate of the silicon containing precursor is between about 40 seem and 200 sccm.

10. The method of claim 1, wherein the flow rate of the silicon containing precursor is between about 70 sccm and 100 sccm.

11. The method of claim 10, wherein the flow rate is about 80 sccm.

12. The method of claim 1, wherein steps (a) and (b) take place in the same process chamber.

13. The method of claim 1, wherein step (a) comprises introducing a bare semiconductor substrate to the reaction chamber.

14. The method of claim 1, further comprising
    (d) treating the substrate with a hydrogen plasma;
    (e) exposing the substrate to a process gas comprising a silicon-containing precursor, to thereby grow a dielectric film via high density plasma chemical vapor deposition; and
    (f) repeating steps (d) and (e) until the gap is substantially filled.

15. The method of claim 1, wherein step (b) comprises introducing a hydrogen-containing treatment gas into the reaction chamber and wherein the hydrogen-containing treatment gas consists substantially of hydrogen.

16. The method of claim 1 wherein the silicon-containing gas is SiH$_4$ or Si$_2$H$_6$.

17. The method of claim 1 wherein the substrate is treated with a hydrogen plasma prior to any dielectric deposition.

18. A method of filling a gap on a semiconductor substrate comprising:
    (a) introducing multiple doses of a silicon-containing precursor gas to thereby grow a dielectric film in the gap via high density plasma chemical vapor deposition; wherein the substrate is treated with a hydrogen plasma prior to each dose and wherein the multiple doses are introduced without any intervening fluorine etch steps.

19. The method of claim 18, wherein step (a) is repeated until the gap is substantially filled.

20. The method of claim 18, further comprising:
    (b) after exposing the substrate to the multiple doses, exposing the substrate to a fluorine etch; and
    (c) repeating steps (a) and (b) until the gap is substantially filled; wherein step (b) is performed no more than 4 times.

21. The method of claim 18, where step (a) comprises introducing at least 3 doses.

* * * * *

UNITED STATES PATENT AND TRADEMARK OFFICE
CERTIFICATE OF CORRECTION

| | | |
|---|---|---|
| PATENT NO. | : 7,211,525 B1 | Page 1 of 1 |
| APPLICATION NO. | : 11/082369 | |
| DATED | : May 1, 2007 | |
| INVENTOR(S) | : Shanker et al. | |

It is certified that error appears in the above-identified patent and that said Letters Patent is hereby corrected as shown below:

In the Claims:

In line 2 of claim 9 [column 14, line 10] change "seem" to --sccm--.

Signed and Sealed this

Sixth Day of May, 2008

JON W. DUDAS
*Director of the United States Patent and Trademark Office*